May 12, 1959 A. A. GOLDBERG ET AL 2,886,709

TELEVISION RECEIVER TUNING INDICATOR

Filed May 1, 1956

*INVENTORS*
ABRAHAM A. GOLDBERG &
JAMES J. DUGGAN
*BY*
Campbell, Brumbaugh, Free + Graves
their *ATTORNEYS*

2,886,709

TELEVISION RECEIVER TUNING INDICATOR

Abraham A. Goldberg, Teaneck, N.J., and James J. Duggan, East Meadow, N.Y., assignors to Columbia Broadcasting Company, Inc., New York, N.Y., a corporation of New York Application May 1, 1956, Serial No. 581,898

3 Claims. (Cl. 250—40)

This invention relates to indicator circuitry that facilitates the precise tuning of television receivers.

Some difficulty exists in tuning television receivers accurately to a desired channel. This is true because such tuning is usually accomplished near the picture tube and it is difficult to determine exactly when an optimum image is being received. Therefore, it would be desirable to incorporate a simple indicator in television receivers that would indicate proper receiver tuning with a high degree of accuracy.

Accordingly, it is a primary object of the present invention to provide an indicator facilitating rapid and accurate tuning of television receivers.

This and further objects of the invention are accomplished by coupling a detector through a tuned circuit to the television receiver intermediate frequency (I.-F.) amplifier output, such tuned coupling being arranged to provide for minimum amplitude output signals from the detector when the frequency of the I.-F. sound carrier corresponds to the I.-F. sound trap frequency. An indicator such, for example, as a tuning eye tube receives the output of the detector to provide a guide for tuning the receiver precisely to a particular channel.

These and further objects and advantages of the present invention will be more readily understood when the following description is read in connection with the accompanying drawings in which.

Figure 1:
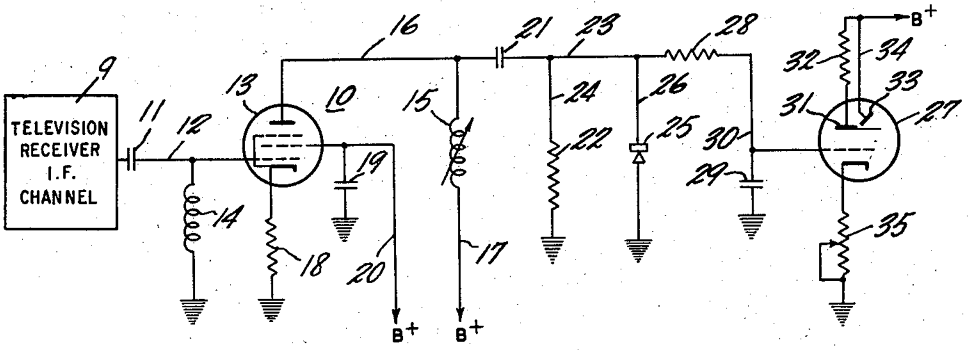
Figure 1 is a schematic circuit diagram illustrating a typical embodiment of the present invention.

Referring to an illustrative embodiment of the invention in greater detail with particular reference to Figure 1, a tuned amplifier 10 is loosely coupled by a small capacitor 11 and a conductor 12 to the output of the last I.-F. amplifier in a television receiver intermediate frequency channel 9. The amplifier 10 includes a pentode 13 having a tuned coil 14 in its grid circuit. In addition, the amplifier 10 includes a tunable coil 15 coupled by a conductor 16 to the anode of the pentode 13, the other side of coil 15 being connected through a conductor 17 to a source of positive potential. The remaining electrodes of the pentode 13 are connected in conventional fashion, a cathode bias resistor 18 and a screen bypass capacitor 19 being provided, the screen also being joined through a conductor 20 to a source of positive potential.

A capacitor 21 couples the output of the amplifier 10 to a load resistor 22, through conductors 23 and 24, and to a crystal diode detector 25 through conductors 23 and 26. The output of the diode 25 is applied to the grid of a tuning indicator tube 27 through a filter, including a series resistor 28 and a grounded capacitor 29, and a conductor 30.

The tube 27 may, for example, be a 6E5 tuning eye tube that has its plate 31 connected through a suitable dropping resistor 32 to a source of positive potential, a conical electrode 33 being joined by a conductor 34 to the same source of potential. In addition, a variable resistor 35 in the cathode circuit of the tube 27 permits adjustment of the sensitivity of the tuning eye indicator 27.

Figure 2:
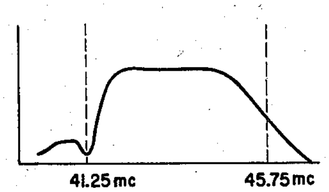
Figure 2 is an I.-F. amplitude response curve helpful in explaining the operation of the circuitry of Figure 1.

In understanding the operation of the above-described circuitry, reference should be made to the I.-F. amplitude response curve of Figure 2 which clearly illustrates the sound trap notch at 41.25 megacycles (mc.), this being the frequency now utilized in television sets. Of course, other I.-F. sound carrier frequencies may be utilized resulting in different I.-F. trap frequencies. On the other side of the response curve is indicated the picture carrier frequency of 45.75 mc.

Figure 3:
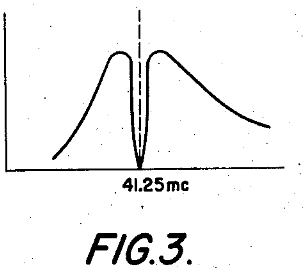
Figure 3 is a curve illustrating the combined response of the I.-F. amplifier and coupling circuit of Figure 1.

A television receiver is correctly tuned when the frequency of the I.-F. sound carrier corresponds to the I.-F. sound trap frequency, the carrier falling directly in the middle of the I.-F. sound trap notch when this occurs, as shown in Figure 2. In order to provide a positive indication of this relation, the tuned amplfier 10 is utilized to supply the response curve of Figure 3 wherein the notch is substantially symmetrical. This is achieved by tuning the coil 15 in the plate circuit of the pentode 13 to a frequency slightly lower than 41.25 mc.

In operation, assuming that the television receiver is initially mistuned, the sound carrier will fall outside of the 41.25 mc. notch and accordingly, the signals received and amplified by the amplifier 10 from the I.-F. channel 9 will not be at their minimum amplitude. Positive pulses will be developed across the load resistor 22 in response to the sound carrier and when smoothed by the resistor 28 and capacitor 29 and applied to the grid of the tuning eye 27, such signals will open the eye of the indicator 27. As the television receiver is tuned to move the sound carrier into the 41.25 mc. notch, the signals coupled to the detector will reach a minimum amplitude at which time the tuning eye 27 will be almost closed and will start opening if the television receiver is tuned in either direction. The use of the tuned amplifier 10 to provide a symmetrical notch renders such tuning action extremely smooth and reliable.

It should be noted that it is desirable to have the angle of the eye presented by the tube 27 decrease while the receiver is being tuned in the proper direction toward the channel, the reason for this being that the eye angle when plotted against the grid control voltage is not linear, the largest change in the angle per volt taking place when the eye is open. Therefore, if the eye angle decreases as the channel is being properly tuned, the resultant eye action is relatively smooth when the sound carrier enters the sharp notch at 41.25 megacycles.

Figure 4:
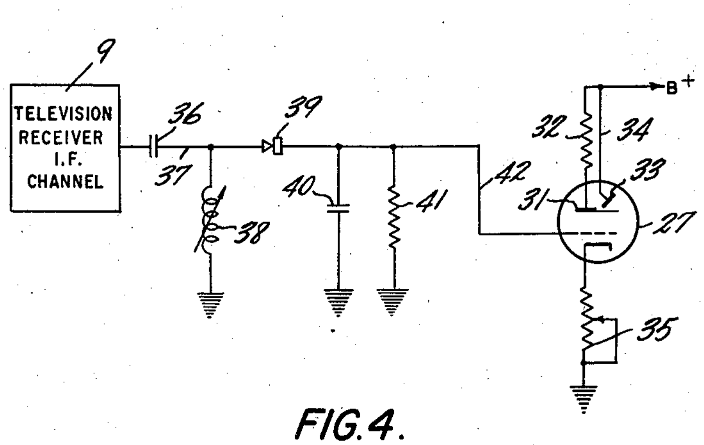
Figure 4 is a schematic circuit diagram of another embodiment of the present invention.

A further embodiment of the invention is illustrated in Figure 4 in which the amplifier 10 is omitted to simplify the tuning indicator circuitry. In this embodiment, a capacitor 36 and a conductor 37 couple a tunable coil 38 to the output of the last I.-F. amplifier in a television receiver I.-F. channel 9. The signals across the coil 38 are detected by a crystal diode 39, smoothed by a network including a capacitor 40 and a resistor 41, and coupled by a conductor 42 to the grid of the tuning eye tube 27.

The operation of this circuit will be self evident when considered in connection with the operation of the circuit shown in Figure 1, the coil 38 being tuned slightly below 41.25 mc. to make the notch appear symmetrical to the detector 39. When the sound carrier is tuned to the center of the notch, the positive voltage across the network including the capacitor 40 and the resistor 41 will be at minimum amplitude so that the eye of the tube 27 will be closed to its greatest extent and the television set properly tuned. Of course, the notch is not as sharp as that obtained with the Figure 1 arrangement in view of the lack of a high gain amplifier between the detector and the I.-F. amplifier.

It will be understood that the above-described embodiments of the invention are illustrative only and modifications thereof will occur to those skilled in the art. Therefore, the invention is not to be limited to the specific apparatus disclosed herein but is to be defined by the appended claims.

We claim:

1. A television tuning indicator for use in a television receiver comprising an intermediate frequency channel having an amplitude response characteristic incorporating an unsymmetrical sound trap notch of greater amplitude in the direction of increasing frequency than in the direction of decreasing frequency, an indicator, a detector having its output coupled to the indicator, and tuned circuit means coupling the detector to the output of the intermediate frequency channel in the television receiver, the tuned circuit means being tuned to a single frequency peak slightly below the intermediate frequency sound trap frequency of the television receiver to compensate for the unsymmetrical sound trap notch and provide an overall amplitude response characteristic above, at and below the sound trap frequency in the form of a substantially symmetrical notch, whereby indications may be readily obtained when the frequency of the intermediate frequency sound carrier varies either side of the intermediate frequency sound trap frequency.

2. A television tuning indicator for use in a television receiver comprising an intermediate frequency channel having an amplitude response characteristic incorporating an unsymmetrical sound trap notch of greater amplitude in the direction of increasing frequency than in the direction of decreasing frequency, an indicator, a detector having its output coupled to the indicator, a tuned amplifier coupling the detector to the output of the intermediate frequency channel in the television receiver, the tuned amplifier being tuned to a single frequency peak slightly below the intermediate frequency sound trap frequency of the television receiver to compensate for the unsymmetrical sound trap notch and provide an overall amplitude response characteristic above, at and below the sound trap frequency in the form of a substantially symmetrical notch, whereby indications may be readily obtained when the frequency of the intermediate frequency sound carrier varies either side of the intermediate frequency sound trap frequency.

3. A television tuning indicator for use in a television receiver comprising an intermediate frequency channel having an amplitude response characteristic incorporating an unsymmetrical sound trap notch of greater amplitude in the direction of increasing frequency than in the direction of decreasing frequency, a tuning eye tube, a detector having its output coupled by a filter to the grid of said tube, a tuned amplifier coupling the detector to the output of the intermediate frequency channel in the television receiver, the tuned amplifier being tuned to a single frequency peak slightly below the intermediate frequency sound trap frequency of the television receiver to compensate for the unsymmetrical sound trap notch and provide an overall amplitude response characteristic above, at, and below the sound trap frequency in the form of a substantially symmetrical notch, whereby indications may be readily obtained when the frequency of the intermediate frequency sound carrier varies either side of the intermediate frequency sound trap frequency.

References Cited in the file of this patent

UNITED STATES PATENTS

| | | |
|---|---|---|
| 2,245,717 | Roberts | June 17, 1941 |
| 2,286,412 | Herold | June 16, 1942 |
| 2,353,468 | Holst | July 11, 1944 |
| 2,449,412 | Rathenau | Sept. 14, 1948 |